United States Patent [19]

Gampper et al.

[11] Patent Number: 6,088,699

[45] Date of Patent: Jul. 11, 2000

[54] SYSTEM FOR EXCHANGING COMPRESSED DATA ACCORDING TO PREDETERMINED DICTIONARY CODES

[75] Inventors: James Michael Gampper; Daniel Charles Wolfe, both of Tucson, Ariz.

[73] Assignee: International Business Machines Corporation, Armonk, N.Y.

[21] Appl. No.: 09/064,883

[22] Filed: Apr. 22, 1998

[51] Int. Cl.[7] .................................................. G06F 17/30
[52] U.S. Cl. .................................... 707/10; 707/3; 707/1; 709/203; 709/217; 709/218; 709/219; 709/227; 341/67; 341/87; 341/106; 341/107
[58] Field of Search ....................... 341/20–35, 173–192, 341/106, 107, 67, 87; 709/200–253; 707/10, 1, 3, 227

[56] References Cited

U.S. PATENT DOCUMENTS

| | | | |
|---|---|---|---|
| 4,505,602 | 3/1985 | Wong | 400/110 |
| 5,153,591 | 10/1992 | Clark | 341/51 |
| 5,323,155 | 6/1994 | Iyer et al. | 341/51 |
| 5,373,290 | 12/1994 | Lempel et al. | 341/51 |
| 5,396,228 | 3/1995 | Garahi | 340/825.44 |
| 5,442,350 | 8/1995 | Iyer et al. | 341/51 |
| 5,455,576 | 10/1995 | Clark, II et al. | 341/50 |
| 5,574,906 | 11/1996 | Morris | 707/1 |
| 5,588,056 | 12/1996 | Ganesan | 380/4 |
| 5,635,931 | 6/1997 | Franaszek et al. | 341/51 |
| 5,737,619 | 4/1998 | Judson | 395/761 |
| 5,832,499 | 11/1998 | Gustman | 707/103 |
| 5,850,448 | 12/1998 | Ganesan | 380/25 |
| 5,908,467 | 6/1999 | Barrett et al. | 709/218 |

OTHER PUBLICATIONS (Abstract) Revuz et al., "DZ: A Text Compression Algorithm for Natural Languages . . . ", Combinatorial Pattern Matching, Third Annual Symposium, 1992.

(Abstract) Farach et al., "Optimal Parallel Dictionary Matching and Compression", SPAA '95 7th Annual ACM Symposium on parallel Algorithms and Architectures, 1995.

(Abstract) K. I. Akman, "A New Text Compression Technique Based on Language Structure", J. Inf. Sci., vol. 21, No. 2, 1995.

*Primary Examiner*—Thomas G. Black
*Assistant Examiner*—Jean M Corrielus
*Attorney, Agent, or Firm*—Dan Hubert & Assoc.

[57] ABSTRACT

Messages containing non-dictionary and dictionary data objects are quickly exchanged between sending and receiving devices. Data stores of the devices contain a common dictionary cross-referencing each of multiple data objects with a different dictionary index code. Data objects in the dictionary are likely to be frequently exchanged. Prior to transmission of data objects, the sending device searches its dictionary for each data object. Each data object may include text, graphics, program segments, or another type of data object. If the data object appears in the dictionary, the sending device obtains its dictionary index code. Next, the sending device transmits a message representing the data objects to the receiving device. The message includes multiple subparts each corresponding to a different data object. If a data object is not present in the dictionary, its subpart comprises the content of the data object without any dictionary encoding. If a data object is represented in the dictionary, its subpart comprises the data object's index code from the dictionary. Flags included in the message distinguish between dictionary and non-dictionary subparts. The receiving device interprets received messages, reviewing flags in the message to determine which subparts comprise dictionary index codes. Each index code is cross-referenced in the receiving device's dictionary to obtain the unencoded data object, which is provided as an output. Each non-dictionary data object is provided as an output directly.

34 Claims, 4 Drawing Sheets

SYSTEM FOR EXCHANGING COMPRESSED DATA ACCORDING TO PREDETERMINED DICTIONARY CODES

BACKGROUND OF THE INVENTION

1. Field of the Invention

The present invention relates to the exchange of electronically represented data between separate computers, or between subcomponents of one computer. More particularly, the invention concerns a communication system for exchanging data objects such as text, graphics, program segments, and the like according to a dictionary known in advance by both sending and receiving devices. After indexing the source data objects in the dictionary, the sending device transmits a message including dictionary index codes comprising encoded representations of objects found in the dictionary, along with non-dictionary data objects in unencoded form.

2. Description of the Related Art

Along with the rising capabilities of modern computers, there is a rising tide of electronic information to store, process, send, and receive. Engineers are squarely meeting the challenge of higher data storage requirements with magnetic hard drives, tape drives, and other data storage devices with increasingly dense data storage. Processing capability is also escalating, as exemplified by semiconductor companies' frequent releases of increasingly powerful microprocessors.

Although advances have been made, data exchange speed still remains a bottleneck in many cases. Despite having purchased a speedy processor and large-capacity storage drive, for example, a computer user might still be frustrated with 28.8 Kbps communication with another computer over a telephone line. In another example, a computer user with access to an enterprise internet ("Intranet") may experience slow downloading due to network loading by other computer users. Accordingly, communications between two computers ("inter-computer" communications) can be one source of communications related frustration. Another communication related delay concerns the electronic data exchange between components of one computing device ("intra-computer" communications). For example, it may be time consuming to read data from a relatively slow storage device such as a floppy diskette drive, or for a processor to retrieve data from nonvolatile storage such as tape.

Data exchange delays, then, can be a problem in both inter-computer and intra-computer communications. The source of this problem may be the limitations of the communication link itself, such as the maximum baud rate of a telephone line. In other cases, communications may be slowed by an interface to a communications link, such as a modem, input/output ("I/O") channel, bus, etc. In the intra-computer context, the source of data delays may be the data storage medium.

One approach to expedite intra-computer communications is to store frequently used data and program segments in a fast-access storage cache. Caching recognizes that the exchange of data and program segments is frequently "redundant" because the same items are sent and received over and over again. Thus, instead of repeatedly retrieving the same items from one relatively slow storage, these items are stored in a fast-access cache. Although caching is beneficial for many applications, caching has several limitations. First, there is a startup time penalty users pay to initially stage data from storage into the cache. Moreover, this startup penalty is enhanced when the link between the cache and storage is noisy, busy, or otherwise slow.

Also in the intra-computer environment, a different approach to speed electronic communications is to compress the transmitted data and therefore decrease its transmission time. The Lempel-Ziv technique is one popular encoding algorithm, which uses "dynamic encoding." The Lempel-Ziv approach searches data for repeating strings and represents each string as an entry in a compression dictionary. Each dictionary is therefore unique to a particular data set. The Lempel-Ziv technique is especially useful in some contexts, such as pre-storage data compression in order to save valuable storage space. And, because the compressed data may be transmitted to the storage medium more quickly, this technique has the incidental benefit of reducing the time required to send the data to storage. Nonetheless, this technique is not well suited to the overall purpose of expediting communications, for several reasons. First, although compressed data sets can be transmitted more quickly than their uncompressed counterparts, the compression process demands a considerable processing time and resources, thereby increasing the overall data exchange time. Additionally, communications are further retarded because an entire compression dictionary must be transmitted to the receiving site for it to properly interpret the compressed data.

Consequently, due to certain unsolved problems such as those described above, known electronic communication systems are not completely adequate for some applications.

SUMMARY OF THE INVENTION

Broadly, the present invention concerns a system for exchanging electronic messages including uncompressed along with compressed data objects. Compressed ("dictionary") data objects are encoded according to a predetermined dictionary known to both the sending device and the receiving device in advance of the message exchange. Recognizable flags distinguish between dictionary and non-dictionary data objects.

More particularly, both sending and receiving devices include respective processors and digital data stores. First, a common dictionary is established in both digital data stores, where this dictionary contains copies of data objects likely to be frequently exchanged between the sending and receiving devices. These data objects may include text, graphics, program segments, and other types of data. The dictionary cross-references each data object copy with a different representative dictionary index code, which is substantially smaller than its data object counterpart. Each index code may be generated by encoding its counterpart data object according to an encoding or compression routine, by arbitrary selection, or another technique.

Prior to transmitting data objects to the receiving device, the sending device searches its dictionary for each data object. If a data object appears in the dictionary, the sending device obtains the representative dictionary index code cross-referenced to the data object. The sending device transmits a message representing the data objects to the receiving device. The message includes multiple subparts, each corresponding to a different one of the data objects. For those data objects not present in the dictionary ("non-dictionary" data objects), the corresponding message subpart is the content of the data object without any dictionary encoding. For data objects represented in the dictionary ("dictionary" data objects), however, the corresponding message subpart is the data object's index code from the dictionary. As a further part of the message, flags are included to distinguish between non-dictionary and dictionary subparts.

After receiving a message, the receiving device interprets it and provides a representative output. Flags in the message are reviewed to determine which subparts are index codes. Each index code is compared and cross-referenced with the receiving device's dictionary to obtain a corresponding data object, which is provided as an output for that message subpart. For each non-dictionary data object, the output of that message subpart is the data object itself.

In one embodiment, the invention may be implemented to provide a method to exchange electronic messages including non-dictionary along with dictionary indexed data objects. In another embodiment, the invention may be implemented to provide an apparatus, such as a single computer or separate sending and receiving computers, to exchange electronic messages including non-dictionary along with dictionary indexed data objects. In still another embodiment, the invention may be implemented to provide a signal-bearing medium tangibly embodying a program of machine-readable instructions executable by a digital data processing apparatus to perform method steps for sending and/or receiving electronic messages including non-dictionary along with dictionary indexed data objects.

The invention affords its users with a number of distinct advantages. Chiefly, the invention substantially expedites the exchange of messages between sending and receiving devices, because the messages are greatly compressed. Instead of occupying valuable bandwidth with unwieldy graphics objects, text objects, and program segments, representative codes are exchanged instead. This technique also promotes the accuracy of data transmission, since known unencoded data objects are already present in the receiving machine's storage, avoiding the need to transmit and possibly corrupt such data. Security is also enhanced; rather than downloading program segments repeatedly from possibly tainted sources, these segments are reliably retrieved from the receiving device's local storage. The invention also provides a number of other advantages and benefits, which should be apparent from the following description of the invention.

DETAILED DESCRIPTION

The nature, objectives, and advantages of the invention will become more apparent to those skilled in the art after considering the following detailed description in connection with the accompanying drawings. As mentioned above, the invention concerns a communication system for exchanging data objects such as text, graphics, program segments, and the like according to a dictionary known in advance by both sending and receiving devices.

HARDWARE COMPONENTS & INTERCONNECTIONS

Data Exchange System

Figure 1:
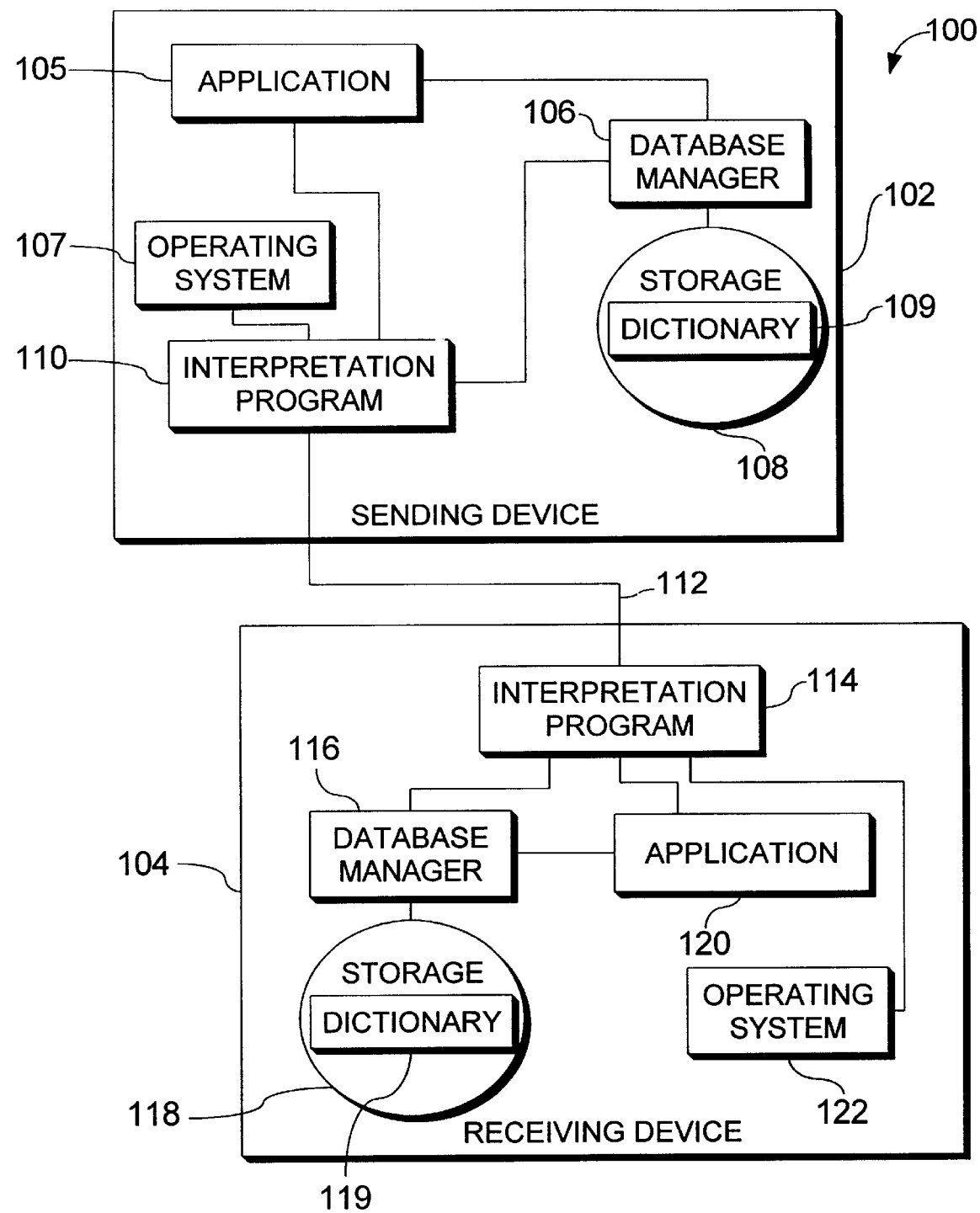
FIG. 1 is a block diagram of the hardware components and interconnections of a data exchange system, configured to exchange non-dictionary and dictionary indexed data objects using a predefined dictionary in accordance with the invention.

One aspect of the invention concerns a data exchange system, which may be embodied by various hardware components and interconnections as shown by the data exchange system 100 described in FIG. 1. Data may be exchanged in many different environments using the principles of this invention; the system 100 is provided to thoroughly illustrate one particular example.

The system 100 includes a sending device 102 and a receiving device 104. Each of the devices 102/104 comprises a computer of suitable processing and input/output ("I/O") capability to achieve the functions of the invention, as described in greater detail below. As an example, one or both devices 102/104 may comprise personal computers, workstations, mainframe computers, supercomputers, digital switches, notebook computers, computer subcomponents, microprocessor system, or another type of digital data processing machine. In some arrangements, the devices 102/104 may even be subcomponents of the same computer. The devices 102/104 are interconnected by a communications link 112 comprising a wire, cable, fiber optic link, bus, computer backplane, wide or local area network, public or private Internet, satellite, wireless connection, or another suitable construct for exchanging digital data communications. Communications over the link 112 may use any suitable protocol, such as TCP/IP, Ethernet, etc.

Although the invention is not limited to this context, the example of FIG. 1 will be described using an environment where the transmitting device 102 is a network server and the receiving device 104 is a networked computer. The invention is especially advantageous in an environment where the receiving device 104 comprises a "thin client," which enables its user to engage in one or more application programs that are actually resident on the sending device 102. In this environment, the sending device 102 may comprise an IBM network computer, such as a series 100, series 300, or series 1000 machine, for example.

The sending device 102 includes an interpretation program 110, database manager 106, storage 108, application program 105, and operating system 107. The sending device 102 may include many other hardware and software components (not shown), these components being well known to those in the computer arts but unnecessary to illustrate the invention. To provide a tangible example, the application program 105 comprises an Internet browser that the sending device 102 is running on behalf of the receiving device 104 as a "thin client." In other words, the operator of the receiving device 104 remotely controls the browser (application program 105), and the browser transmits data objects such as graphics, text, program segments, and program segments as dictionary index codes (described below) to the receiving device 104; in this way, the browser appears to be running on the user's machine 104, with less data exchanged than with known methods. The application program 105 operates under the sending device's operating system 107, which may comprise WINDOWS, MVX, UNIX, or another operating system with suitable features for the present application.

The application program 105 interacts with the storage 108 via the database manager 106. The database manager 106 oversees the storage and retrieval of data in the storage 108, and provides a storage interface for the application program 105 as well as the interpretation program 110. The storage 108 comprises a digital data storage mechanism, such as a magnetic hard drive, removable diskette, CD-ROM, magnetic tape, random access memory ("RAM"), or another device suitable to store digital data signals. The storage 108 contains a dictionary copy 109.

The interpretation program 110 manages the formatting and transmission of data from the sending device 102 to the receiving 104 via the link 112. The interpretation program 110 operates under direction of the application program 105, in accordance with the operating system 107. As mentioned above, an important feature of the present invention is the exchange of non-dictionary as well as dictionary data objects, where dictionary data objects are conveyed in the form of representative dictionary index codes. "Data objects" include program segments (such as executable binary code), text objects, graphics objects, etc. For data objects represented in the dictionary 109, the interpretation program 110 encodes the data objects using the dictionary 109 to obtain a corresponding dictionary index code. Via the link 112, the program 110 transmits these index codes along with the non-dictionary data objects, which are in unencoded form. The dictionary 109 is substantially identical to a counterpart dictionary 119 residing in storage 118 of the receiving device 104.

The receiving device 104 includes an interpretation program 114, database manager 116, storage 118, application program 120, and operating system 122. The receiving device 102 may include many other hardware and software components (not shown), these components being well known to those in the computer arts but unnecessary to illustrate the invention. In the present example, the application program 120 comprises an application performing local tasks to implement the Internet browser actually running on the sending device 102. These functions include, for example, displaying text and graphics, receiving keyboard and mouse input from an operator, etc. The application program 120 operates under the operating system 122, which may be the same or different from the operating system 107.

The application program 120 is coupled to the storage 118 via the database manager 116. The database manager 116 oversees the storage and retrieval of data in the storage 118, and provides a storage interface for the application program 120 and the interpretation program 114. The storage 118 comprises a digital data storage mechanism, such as a magnetic hard drive, removable diskette, CD-ROM, magnetic tape, RAM, or another device suitable to store digital data signals. Within the storage 118 resides the receiving device's dictionary copy 119, a substantial duplicate of the sending device's dictionary 109.

The interpretation program 114 manages the receipt and interpretation of data from the sending device 102 via the link 112. The interpretation program 114 operates under direction of the application program 120, in accordance with the operating system 122. As mentioned above, an important feature of the present invention is the conveyance of non-dictionary as well as dictionary data objects, where dictionary data objects are exchanged in the form of representative index codes. The interpretation program 114 identifies and decodes received index codes using its dictionary 119. Decoding is possible because the dictionary 119 is substantially the same as the dictionary 109 used by the sending device 102 to originally encode data objects for transmission.

As explained in greater detail below, sending and receiving devices may exchange roles. For example, after the sending device 102 transmits a message, the receiving device 104 may respond by returning a message of its own. In this case, the receiving device 104 may assume the role of a sending device by using its dictionary to encode data objects prior to transmission. Depending upon the application, it may be desirable to permit this role exchange to occur repeatedly, back and forth.

Exemplary Digital Data Processing Apparatus

Another aspect of the invention concerns a digital data processing apparatus, provided to implement the features of the sending device 102, receiving device 104, or both. This apparatus may be embodied by various hardware components and interconnections, as shown below.

Figure 2:
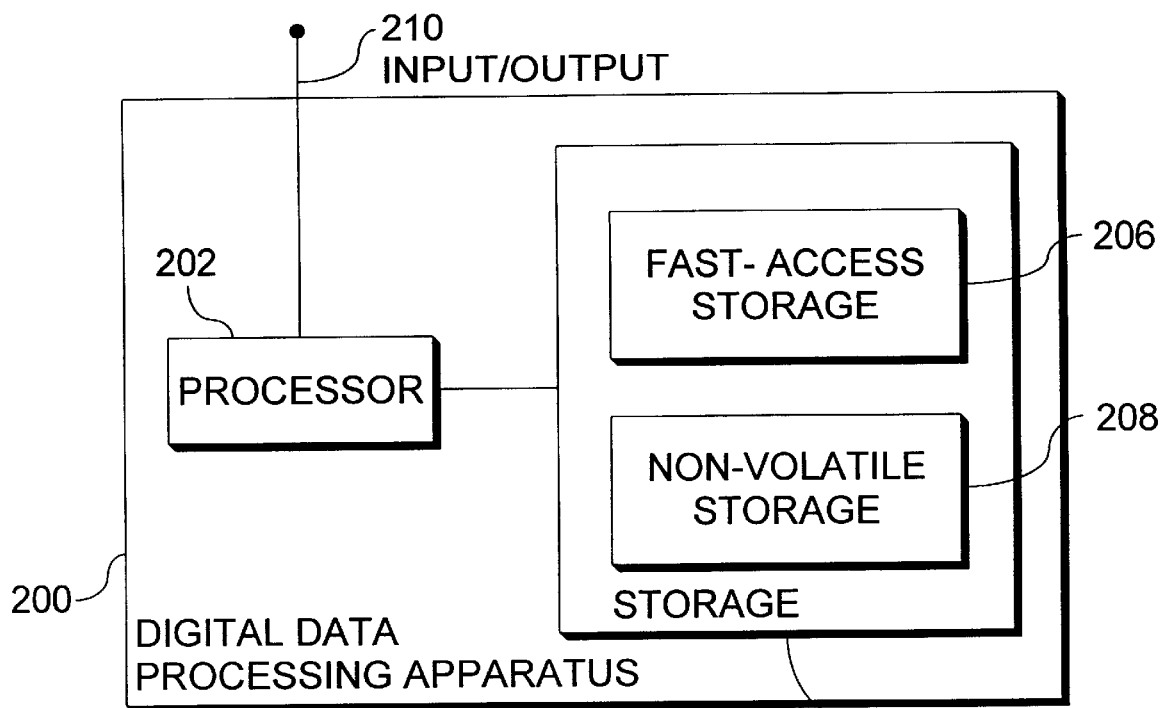
FIG. 2 is a block diagram of an exemplary digital data processing apparatus in accordance with the invention.

FIG. 2 shows an example of one digital data processing apparatus 200. The apparatus 200 includes a processor 202, such as a microprocessor or other processing machine, coupled to a storage 204. In the present example, the storage 204 includes a fast-access storage 206, as well as nonvolatile storage 208. The fast-access storage 206 may comprise RAM, and may be used to store the programming instructions executed by the processor 202 during such execution. The nonvolatile storage 208 may comprise, for example, one or more magnetic data storage disks such as a "hard drive," a tape drive, or any other suitable storage device. The apparatus 200 also includes an input/output 210, such as a line, bus, cable, electromagnetic link, or other means for exchanging data with the processor 202.

Despite the specific foregoing description, ordinarily skilled artisans (having the benefit of this disclosure) will recognize that the apparatus discussed above may be implemented in a machine of different construction, without departing from the scope of the invention. As a specific example, one of the components 206, 208 may be eliminated; furthermore, the storage 204 may be provided on-board the processor 202, or even provided externally to the apparatus 200.

Dictionary Configuration

The dictionaries 109/119 contain copies of data objects especially likely to be repeatedly exchanged between the transmitting and receiving devices 102/104. As an alternative, the dictionaries 109/119 may contain pointers to stored copies of the data objects. Each data object contained in the dictionary is cross-referenced to a different dictionary index code, which comprises an abbreviated code representing that data object. As one example, each compressed code may be a numeric, alphanumeric, alphabetic, or other suitable code that is generated from the data object using an appropriate method such as Ziv-Lempel compression, hashing, artificial intelligence, etc. As a different example, a compressed code may be an arbitrary code selected independently of its data object, but assigned to that data object by the dictionary. Table 1 (below) illustrates one example of a dictionary constructed with arbitrarily selected index codes.

TABLE 1

Exemplary Dictionary

| COPY (OR POINTER TO) DATA OBJECT | ASSIGNED DICTIONARY INDEX CODE |
|---|---|
| "apple," representing a text type data object | 1 |
| a particular bit string compatible with a video card of the receiving device 104, representing a graphics type data object | 2 |
| executable binary code compatible with receiving device 104, representing a program segment type data object | 3 |

In the embodiment illustrated below, each dictionary 109/119 includes multiple dictionaries, one for each type of data object. Thus, there exists a text sub-dictionary, graphics sub-dictionary, and a program segment sub-dictionary. This division speeds the encoding and decoding of data objects.

OPERATION

In addition to the various hardware embodiments described above, a different aspect of the invention concerns a method for exchanging electronic messages including non-dictionary data objects as well as dictionary index codes representing data objects compressed according to a predetermined dictionary known to both the sending device and the receiving device in advance of the message exchange.
Signal-Bearing Media In the context of FIGS. 1 and 2, such a method may be implemented, for example, by operating the sending device 102 and receiving device 104, as embodied by respective digital data processing apparatuses 200, to execute respective sequences of machine-readable instructions. In the case of each device 102/104, these instructions may reside in various types of signal-bearing media. In this respect, one aspect of the present invention concerns a programmed product, comprising signal-bearing media tangibly embodying a program of machine-readable instructions executable by a digital data processor to perform a method to transmit data signals from a sending device to a receiving device. Another aspect involves a programmed product comprising signal-bearing media tangibly embodying a program of machine-readable instructions executable by a digital data processor to perform a method for a receiving device to receive and interpret data signals from a sending device.

Figure 3:
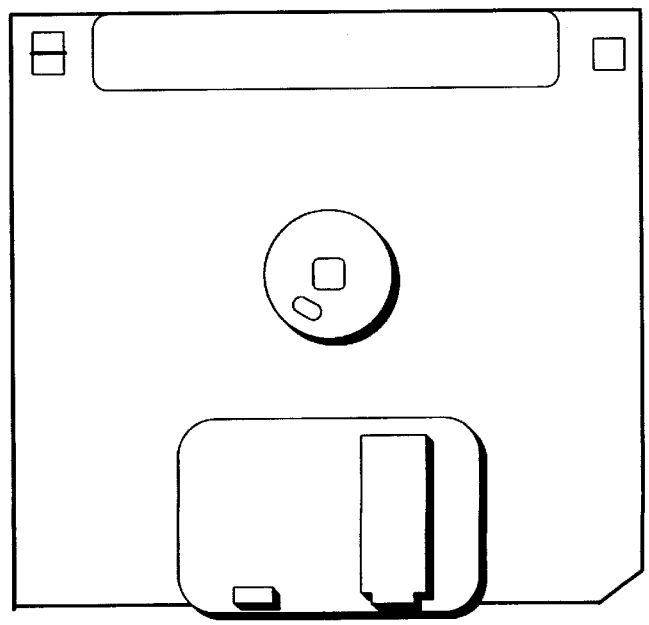
FIG. 3 shows an exemplary signal-bearing medium in accordance with the invention.
Figure 4:
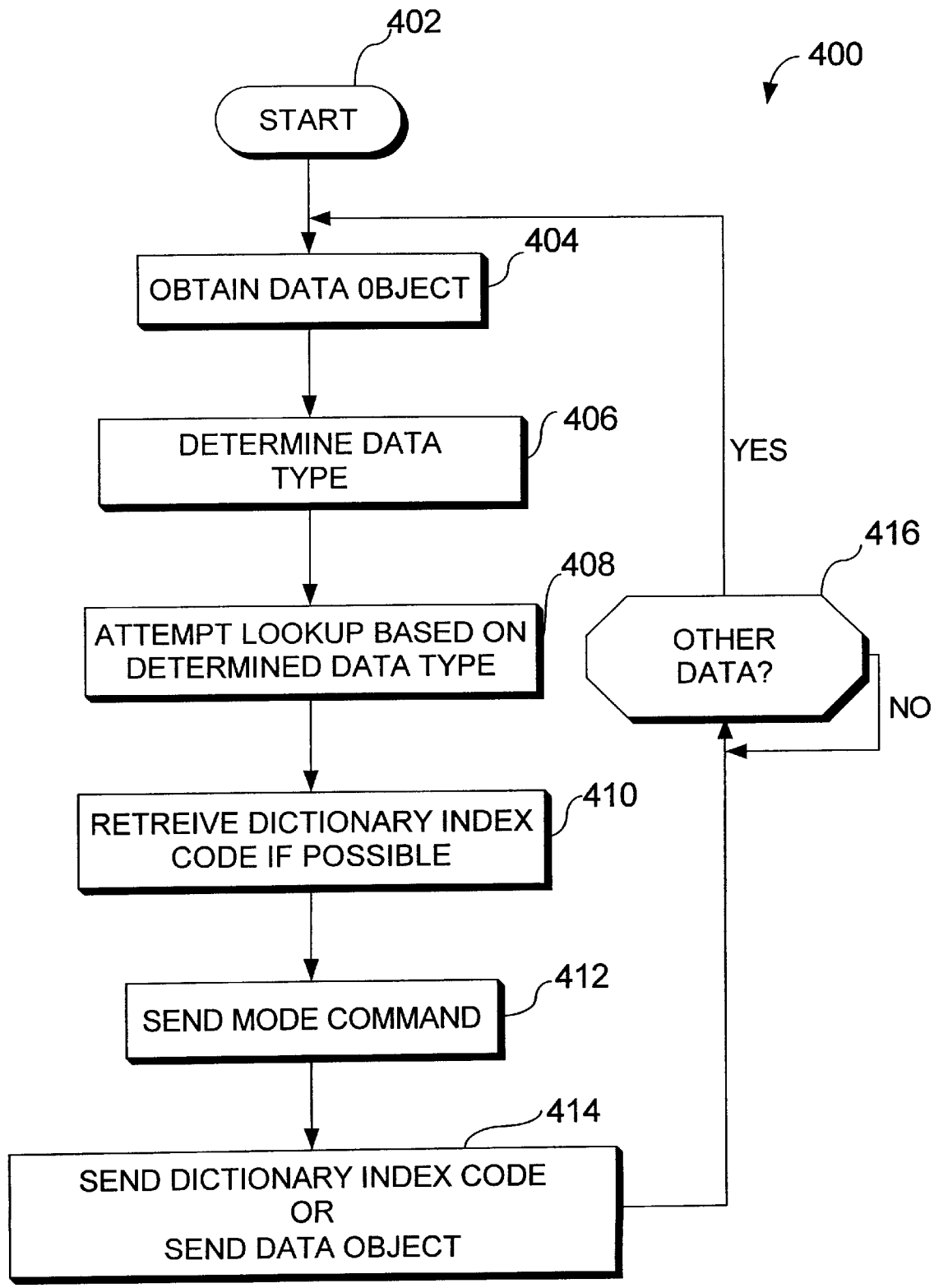
FIG. 4 is a flowchart of an operational sequence for transmitting data objects in accordance with the invention.

Such signal-bearing media may comprise, for example, RAM (not shown) contained within the sending and receiving devices 102/104, as represented by the fast-access storage 206, for example. Alternatively, the instructions may be contained in another signal-bearing media, such as a magnetic data storage diskette 300 (FIG. 3), directly or indirectly accessible by the processor 202. Whether contained in the storage 204, or elsewhere, the instructions may be stored on a variety of machine-readable data storage media, such as DASD storage (e.g., a conventional "hard drive" or a RAID array), magnetic tape, electronic read-only memory (e.g., ROM, EPROM, or EEPROM), an optical storage device (e.g., CD-ROM, WORM, DVD, digital optical tape), paper "punch" cards, or other suitable signal-bearing media including transmission media such as digital and analog and communication links and wireless. In an illustrative embodiment of the invention, the machine-readable instructions may comprise software object code, compiled from a language such as C++, COBOL, BASIC, etc.
Transmitting Data FIG. 4 shows a sequence of method steps 400 to illustrate one exemplary sequence for transmitting data from sending device to receiving device in accordance with the present invention. For ease of explanation, but without any limitation intended thereby, the example of FIG. 4 is described in the context of the system 100 described above.

The present invention recognizes that, in practice, certain "redundant" data objects are likely to be frequently exchanged between a sending device and a receiving device. For example, the Internet browser provided by the sending device 102 may include certain graphics and text objects such as menu bars, pull-down menus, icons, and the like, which are repeatedly transmitted to the receiving device 104 for display thereby. As explained below, the transmit routine 400 encodes redundant data objects using a dictionary, and sends the dictionary index codes instead of the entire data object.

After the steps are initiated in step 402, the sending device's interpretation program 110 obtains a data object to send in step 404. This data object may be obtained in a number of different ways, such as by actively obtaining the data object from storage or a software routine, or by receiving the data object from delivery by another hardware or software module. In the illustrated example, this data arises from the application program 105, which passes the data to the interpretation program 110 or points the interpretation program 110 to a location where the data resides. As a more specific example, where the application program 105 is running an Internet browser for the receiving device, the application program 105 may receive a combination of text data, graphics, and program segments (such as JAVA byte code) from a public or private Internet, and provide this data to the interpretation program 110 to forward to the receiving device 104 for display or other execution by the receiving device 104.

The data obtained in step 404 is one item of data, and such data may come in a variety of forms, such as text, program segments (e.g., JAVA byte code, executable binary code, compiled object code, source code, etc.), graphics objects (such as a "JPG" or bitmap object), or another form of data. The illustrated example recognizes three types of data objects: (1) text, (2) program segments, and (3) graphics. These different forms of data are called "types," and a particular item of data is called a "data object." The invention may additionally recognize other types of data object as well, as will be apparent to those of ordinarily skill in the applicable art. One or more data objects transmitted together, as discussed below, comprise a "message."

In step 406, the interpretation program 110 determines the type of the data object obtained in step 404. This is performed to ensure that the interpretation program 110 consults the correct dictionary to encode the data object. Step 406 may be achieved, for example, by examining the data object's content, filename, or another one or more properties. As an example, step 406 may determine that a data object is a graphics object because its filename extension is "JPG," "BMP," "GIF," etc.

After step 406, the interpretation program 110 in step 408 attempts to look up the data object in the appropriate part of the dictionary 109. If the data object obtained in step 404 is a text data object, for instance, the interpretation program 110 consults the text sub-dictionary of the dictionary 109. In practice, step 408 is carried out by consulting the database manager 106, which in turn accesses the storage 108. As an example, step 408 may be executed by performing a comparison between dictionary entries and the data object obtained in step 404. This comparison may be performed on a suitable basis, such as bit-by-bit ("bit-wise"), byte-by-byte, etc.

The data object might (or might not) be listed in the dictionary 109, depending upon whether the construction of the dictionary 109 anticipated that particular data object. If the data object is found in the dictionary, the data object is a "dictionary" data object; in this case, step 410 retrieves the data object's dictionary index code.

Next, the interpretation program 110 in step 412 commences sending of the data object to the receiving device 104. Messages transmitted to the receiving device 104 may include dictionary index codes representing data objects listed in the dictionary, as well as non-dictionary data objects not found in the dictionary. Accordingly, some means is needed to distinguish the two. In the present example, this function is provided by "mode commands," which may also be called "flags." In the illustrated example, each mode command is associated with one data object; such association may be by proximity (e.g., immediately preceding the data object), by a list, by order, or by another association. Mode commands may be implemented in a number of different ways to distinguish between dictionary and non-dictionary message subparts, e.g., identifying dictionary data objects, non-dictionary data objects, both dictionary and non-dictionary data objects, etc.

In a different embodiment, each mode command identifies an ensuing data object (1) whose source sub-dictionary is different from that of the preceding data object sent by the device 102, or (2) whose dictionary or non-dictionary status is different from the preceding data object sent by the device 102. In this embodiment, mode commands occur in a message to indicate a change in dictionary or non-dictionary status of data objects, and any change in the sub-dictionary used for encoding even when there is no change between dictionary and non-dictionary status.

Table 2 (below) shows one example of this protocol, where "M" indicates a mode command and "D" represents a data object.

TABLE 2

Exemplary Message $M_d, D_{d1}, D_{d2}, M_{nd}, D_{nd1}, D_{nd2}$

In the example of Table 2, the message includes a first mode command ($M_d$, signifying ensuing dictionary index codes), two dictionary index codes ($D_{d1}, D_{d2}$), a second mode command ($M_{nd}$, signifying ensuing non-dictionary data objects), and finally two non-dictionary data objects ($D_{nd1}, D_{nd2}$).

In accordance with the foregoing, the interpretation program 110 in step 412 sends a mode command if applicable. If the current data object is in the dictionary 109 and the previous data object was also in the same dictionary, no mode command is needed in the present example.

After step 412, the interpretation program 110 in step 414 sends the dictionary index code if the current data object was found in a dictionary. Additionally, a sub-dictionary identifier ("ID") is sent, this ID comprising alphabetic, numeric, alphanumeric, or other code identifying the particular sub-dictionary used to generate the associated dictionary index code. Namely, if multiple dictionaries are used, as in the present example, an identification of the appropriate dictionary is also needed.

In contrast to the foregoing, if the current data object is not present in a dictionary, the data object is sent in step 414 without dictionary encoding.

Whether the data object is present in the dictionary or not, it will be apparent to ordinarily skilled artisans that steps 412 and 414 may be implemented by building a single record containing these components and preceded by an appropriate header.

Aside from encoding of data objects using the dictionary 109, the sending device 102 applies an encoding scheme to dictionary and non-dictionary data alike, to represent these data objects as machine-readable signals suitable for sending over the link 112. This encoding scheme may comprise any suitable technique for machine-readable presentation of the data objects, such as ASCII encoding. In this respect, both dictionary and non-dictionary data objects are encoded. Still, only dictionary data objects are represented by dictionary index codes according to the dictionary 109. In an alternative embodiment, where the dictionary index codes are machine-compatible entities such as binary numbers, dictionary data objects may be sent without any further encoding, by sending the representative dictionary index codes. In this embodiment, the non-dictionary data objects are encoded using the ASCII or other pre-transmission, non-dictionary encoding.

After step 414, step 416 asks whether there are any other data objects to be sent. If so, the routine 400 returns to step 404, discussed above.

Receiving and Interpreting Data

Figure 5:
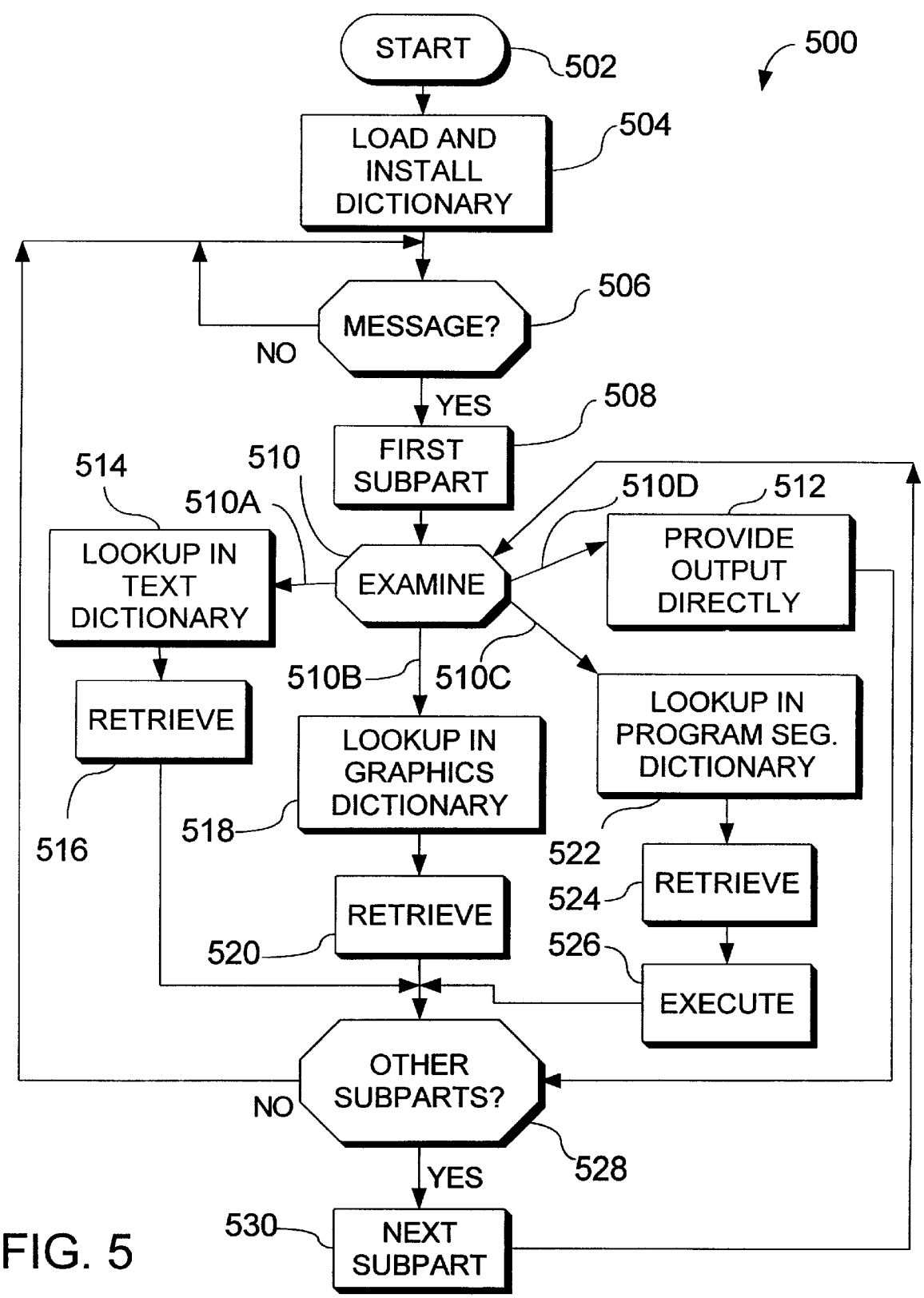
FIG. 5 is a flowchart of an operational sequence for receiving and interpreting data objects in accordance with the invention.

FIG. 5 shows a sequence of method steps 500 to illustrate one exemplary sequence for the receiving device 104 to receive and interpret data from the sending device 102 in accordance with the invention. For ease of explanation, but without any limitation intended thereby, the example of FIG. 5 is described in the context of the system 100 described above. The steps are initiated in step 502. In the routine 500, the interpretation program 114 works to receive and interpret messages including dictionary and non-dictionary data from the sending device 102, and provide an output of the underlying non-dictionary data to the application program 120.

In step 504, the receiving device 104 installs the dictionary 119 to the storage 118. As an example, this may be performed by the database manager 116. As mentioned above, the dictionary 119 as illustrated actually includes multiple sub-dictionaries, one for each different type of data object. Step 504 may be a one-time event, or it may be repeated occasionally when both dictionaries 109/119 merit updating. After step 504, the interpretation program 114 detects receipt of an input message from the sending device 102 in step 506. This message may, for example, be formatted as shown in Table 2, above.

In step 508, the interpretation program 114 proceeds to examine the first subpart in the received message, making this subpart the "current" subpart. Step 510 determines whether the current subpart is in the dictionary or not; if it is, step 510 also determines the type of the represented data object, i.e., graphics, text, or program segment. Step 510 includes actions such as the following:

1. To determine whether the subpart is in the dictionary, the program 114 references the mode command (or lack thereof) associated with the current subpart, or the most recent mode command from another subpart.
2. The program 114 references the sub-dictionary ID included with the current subpart.
3. The program 114 considers other properties of the current subpart, such as filename, etc.
4. The program 114 performs a comparison (e.g., bitwise) of the current subpart and entries of the dictionary 119.

If the current subpart is not in the dictionary 119, path 510D is taken to step 512. In step 512, the interpretation program 114 provides the application program 120 with an output of the content of the subpart, which in this case comprises an unencoded non-dictionary data object. No complicated interpretation is necessary, since the data object was not in the dictionary, and hence unencoded.

In contrast, if the current subpart is a text type dictionary index code, path 510A is taken to step 514. In step 514, the interpretation program cross-references this index code in the text sub-dictionary of the dictionary 119 to identify the corresponding text data object. Then, in step 516 the interpretation program 114 directs the database manager 116 to retrieve this text data object from the text sub-dictionary.

Similarly, if the current subpart is a graphics type dictionary index code, path 510B is taken to step 518. In step 518, the interpretation program cross-references this index code in the graphics sub-dictionary of the dictionary 119 to identify the corresponding graphics data object. Then, in step 520 the interpretation program 114 directs the database manager 116 to retrieve this graphics data object from the graphics sub-dictionary.

Likewise, if the current subpart is a program segment type dictionary index code, path 510C is taken to step 522. In step 522, the interpretation program cross-references this index code in the program segment sub-dictionary of the dictionary 119 to identify the corresponding program segment data object. Then, the interpretation program 114 directs the database manager 116 to retrieve the program segment in step 524. In step 526, the interpretation program 114 or other suitable component such as the application program 120, executes the program segment.

After steps 516, 520, 526, or 512, the interpretation program in step 528 determines whether there are any other subparts in the present input message that have not been processed. If so, the next data object becomes the "current" data object in step 530 and the program 500 returns to step 510, discussed above. Otherwise, control passes to step 506 to wait for the next input message.

Role Reversal

The foregoing description illustrates the transmission of one message from sending device to receiving device, and the ensuing interpretation of this message at the receiving device. This description is provided merely to provide a tangible example, however, and the invention also contemplates different techniques for exchanging methods. As one specific example, the invention contemplates reversing the roles of sending and receiving devices. Namely, two devices may exchange messages bidirectionally—after a first device sends and a second device receives, the second device may send while the first device receives. In this case, the roles of sending and receiving devices may be established by various means, such as the act of transmitting a message, pre-message agreement among the devices, role assignment by another machine, etc.

OTHER EMBODIMENTS

While the foregoing disclosure shows a number of illustrative embodiments of the invention, it will be apparent to those skilled in the art that various changes and modifications can be made herein without departing from the scope of the invention as defined by the appended claims. Furthermore, although elements of the invention may be described or claimed in the singular, the plural is contemplated unless limitation to the singular is explicitly stated.

What is claimed is:

1. A method for exchanging data between a sending device and a receiving device, each device including a processor coupled to a digital data store, the method comprising:

the sending and receiving devices maintaining respective dictionaries in their respective digital data stores, each dictionary containing multiple data objects each cross-referenced to a different dictionary index code, where the data objects include data objects having one of the following types: a binary graphics file, or a binary executable program;

in response to the sending device receiving multiple data objects for transmittal to the receiving device, the sending device:

searching for each of the received data objects in the dictionary contained in the sending device's store;

for each data object present in the dictionary, obtaining a representative index code cross-referenced to the data object in the dictionary;

the sending device composing a message for transmittal to the receiving device, the message including multiple subparts each subpart corresponding to a different one of the received data objects, each subpart comprising:

if the corresponding data object is not present in the dictionary, the content of the data object; and if the corresponding data object is present in the dictionary, the index code cross-referenced to the data object;

where the composed message further includes one or more flags distinguishing between index codes and non-dictionary data objects in the message;

the sending device transmitting the composed message to the receiving device; and the receiving device receiving the transmitted message, and in response the receiving device performing operations to process the the message comprising:

reviewing the flags in the received message to identify subparts of the message as index codes or non-dictionary data objects;

for each subpart identified as an index code, cross-referencing the index code in the dictionary contained in the receiving device's store to obtain the cross-referenced data object, and for each obtained data object that is a binary graphics file, operating the receiving device's processor to display an image represented by said binary graphics file;

for each obtained data object that is a binary executable program, operating the receiving device's processor to execute said program; and for each subpart identified as a non-dictionary data object, providing an output of that data object.

2. The method of claim 1, where the data object types further include textual data objects.

3. The method of claim 2, where each dictionary includes multiple sub-dictionaries each sub-dictionary exclusively containing dictionary index codes of a single type of data object.

4. The method of claim 3, the flags further including one or more sub-dictionary identifiers identifying sub-dictionaries containing the dictionary index codes in the composed message.

5. The method of claim 1, the method further comprising constructing the dictionaries and storing the constructed dictionaries in the digital stores, the constructing including forming the dictionary index codes by compressing the cross-referenced data objects according to a predefined compression process.

6. A signal-bearing medium tangibly embodying a program of machine-readable instructions executable by a digital processing apparatus to perform a method for transmitting data from a sending device to a receiving device, each device including a processor coupled to a digital data store, the method comprising:

the sending device maintaining a dictionary in its digital data store, the dictionary containing multiple data objects each cross-referenced to a different dictionary index code, where the data objects include data objects having one of the following types: a binary graphics file, or a binary executable program;

in response to the sending device receiving multiple data objects for transmittal to the receiving device, searching for each of the received data objects in the dictionary contained in the sending device's store;

for each data object present in the dictionary, obtaining a representative index code cross-referenced to the data object in the dictionary; and the sending device composing a message to the receiving device, the message including multiple subparts each subpart corresponding to a different one of the received data objects, each subpart comprising:

if the corresponding data object is not present in the dictionary, the content of the data object; and if the corresponding data object is present in the dictionary, the index code cross-referenced to the data object;

where the composed message further includes one or more flags distinguishing between index codes and non-dictionary data objects in the message.

7. The medium of claim 6, where the data object types further include textual data objects.

8. The medium of claim 7, where each dictionary includes multiple sub-dictionaries each sub-dictionary exclusively containing dictionary index codes of a single type of data object.

9. The medium of claim 8, the flags further including one or more sub-dictionary identifiers identifying sub-dictionaries containing the dictionary index codes in the composed message.

10. The medium of claim 6, the method further comprising constructing the dictionary of the sending device and storing the constructed dictionary in the digital store of the sending device, the constructing including forming the dictionary index codes by compressing the cross-referenced data objects according to a predefined compression process.

11. A signal-bearing medium tangibly embodying a program of machine-readable instructions executable by a digital processing apparatus to perform a method for a receiving device to receive data from a sending device, each device including a processor coupled to a digital data store, the method comprising:

the receiving device maintaining a dictionary in the digital store, the dictionary containing multiple data objects each cross-referenced to a different dictionary index code, where the data objects include data objects having one of the following types: a binary graphics file, or a binary executable program;

the receiving device receiving a message including multiple subparts each subpart corresponding to a different data object and comprising:

if the corresponding data object is not present in the dictionary, the content of the data object; and if the corresponding data object is present in the dictionary, the index code cross-referenced to the data object;

the message further including one or more flags distinguishing between dictionary index codes and non-dictionary data objects; and in response to receiving the message, the receiving device performing operations to process the message comprising:

reviewing the flags in the received message to distinguish between dictionary index codes and non-dictionary data objects;

for each subpart comprising an index code, cross-referencing the index code in the dictionary contained in the receiving device's store to obtain the cross-referenced data object, and for each obtained data object that is a binary graphics file, operating the receiving device's processor to display an image represented by said binary graphics file;

for each obtained data object that is a binary executable program, operating the receiving device's processor to execute said program; and for each subpart comprising a non-dictionary data object, providing an output of the non-dictionary data object.

12. The medium of claim 11, where the data object types further include textual data objects.

13. The medium of claim 12, where each dictionary includes multiple sub-dictionaries each sub-dictionary exclusively containing dictionary index codes of a single type of data object.

14. The medium of claim 13, the flags including one or more sub-dictionary identifiers identifying sub-dictionaries containing the dictionary index codes in the composed message.

15. The medium of claim 12, the method further comprising constructing the dictionary of the receiving device and storing the constructed dictionary in the digital store of the receiving device, the constructing including forming the dictionary index codes by compressing the cross-referenced data objects according to a predefined compression process.

16. A data exchange system including multiple devices, each device including a processor coupled to a digital data store, the devices' processors being programmed to perform the a method for exchanging data, the method comprising:

designating a sending device and a receiving device;

the sending and receiving devices maintaining respective dictionaries in their respective digital data stores, each dictionary containing multiple data objects each cross-referenced to a different dictionary index code, where the data objects include data objects having one of the following types: a binary graphics file, or a binary executable program;

in response to the sending device receiving multiple data objects for transmittal to the receiving device, the sending device:

searching for each of the received data objects in the dictionary contained in the sending device's store;

for each data object present in the dictionary, obtaining a representative index code cross-referenced to the data object in the dictionary;

the sending device composing a message for transmittal to the receiving device, the message including multiple subparts each subpart corresponding to a different one of the received data objects, each subpart comprising:

if the corresponding data object is not present in the dictionary, the content of the data object; and if the corresponding data object is present in the dictionary, the index code cross-referenced to the data object;

where the composed message further includes one or more flags distinguishing between index codes and non-dictionary data objects in the message;

the sending device transmitting the composed message to the receiving device; and the receiving device receiving the transmitted message, and in response the receiving device performing operations to process the message comprising:

reviewing the flags in the received message to identify subparts of the message as index codes or non-dictionary data objects;

for each subpart identified as an index code, cross-referencing the index code in the dictionary contained in the receiving device's store to obtain the cross-referenced data object, and for each obtained data object that is a binary graphics file, operating the receiving device's processor to display an image represented by said binary graphics file;

for each obtained data object that is a binary executable program, operating the receiving device's processor to execute said program; and for each subpart identified as a non-dictionary data object, providing an output of that data object.

17. The system of claim 16, where the data object types further include textual data objects.

18. The system of claim 17, where each dictionary includes multiple sub-dictionaries each sub-dictionary exclusively containing dictionary index codes of a single type of data object.

19. The system of claim 18, the flags including one or more sub-dictionary identifiers identifying sub-dictionaries containing the dictionary index codes in the composed message.

20. The system of claim 16, the method further comprising constructing the dictionaries and storing the constructed dictionaries in the digital stores, the constructing including forming the dictionary index codes by compressing the cross-referenced data objects according to a predefined compression process.

21. A data sending device, comprising:
a digital data store, containing a dictionary containing multiple data objects and cross-referencing each of the data objects with a different dictionary index code, the data objects including data objects having one of the following types: a binary graphics file, or a binary executable program; and
a processor, coupled to the store, and programmed to perform a method for transmitting data to a receiving device, the method comprising:
in response to the sending device receiving multiple data objects for transmittal to the receiving device, the sending device:
searching for each of the received data objects in the dictionary contained in the sending device's store;
for each data object present in the dictionary, obtaining a representative index code cross-referenced to the data object in the dictionary; and
the sending device composing a message to the receiving device, the message including multiple subparts each subpart corresponding to a different one of the received data objects, each subpart comprising:
if the corresponding data object is not present in the dictionary, the content of the data object; and
if the corresponding data object is present in the dictionary, the index code cross-referenced to the data object;
where the composed message further includes one or more flags distinguishing between index codes and non-dictionary data objects in the message.

22. The device of claim 21, where the data object types further include textual data objects.

23. The device of claim 22, where each dictionary includes multiple sub-dictionaries each sub-dictionary exclusively containing dictionary index codes of a different type of data object.

24. The device of claim 23, the flags further including one or more sub-dictionary identifiers identifying sub-dictionaries containing the dictionary index codes in the composed message.

25. The device of claim 21, the method further comprising constructing the dictionary of the sending device and storing the constructed dictionary in the digital store of the sending device, the constructing including forming the dictionary index codes by compressing the cross-referenced data objects according to a predefined compression process.

26. A data receiving device, comprising:
a digital data store containing a dictionary containing multiple data objects and cross-referencing each of the data objects with a different dictionary index code, where the data objects include data objects with one of the following types: a binary graphics file, or a binary executable program; and
a processor, coupled to the store, and programmed to perform a method for receiving data from a sending device, the method comprising:
the receiving device receiving a message including multiple subparts each subpart corresponding to a different data object and comprising:
if the corresponding data object is not present in the dictionary, the content of the data object; and
if the corresponding data object is present in the dictionary, the index code cross-referenced to the data object;
the message further including one or more flags distinguishing between dictionary index codes and non-dictionary data objects; and
in response to receiving the message, the receiving device performing operations to process the message comprising:
reviewing the flags in the received message to distinguish between dictionary index codes and non-dictionary data objects;
for each subpart comprising an index code, cross-referencing the index code in the dictionary contained in the receiving device's store to obtain the cross-referenced data object, and
for each obtained data object that is a binary graphics file, operating the receiving device's processor to display an image represented by said binary graphics file;
for each obtained data object that is a binary executable program, operating the receiving device's processor to execute said program; and
for each subpart comprising a non-dictionary data object, providing an output of the non-dictionary data object.

27. The device of claim 26, where the data object types further include textual data objects.

28. The device of claim 27, where each dictionary includes multiple sub-dictionaries each sub-dictionary exclusively containing dictionary index codes of a different type of data object.

29. The device of claim 28, the flags further including one or more sub-dictionary identifiers identifying sub-dictionaries containing the dictionary index codes in the composed message.

30. The device of claim 26, the method further comprising constructing the dictionary of the receiving device and storing the constructed dictionary in the digital store of the receiving device, the constructing including forming the dictionary index codes by compressing the cross-referenced data objects according to a predefined compression process.

31. A data sending device, comprising:
first means for storing digital data, the first means containing a dictionary containing multiple data objects and cross-referencing each of the data objects with a different dictionary index code, the data objects including data objects with one of the following types: a binary graphics file, or a binary executable program; and
second means, coupled to the store, for transmitting data to a receiving device, by:

in response to the receiving multiple data objects for transmittal to the receiving device, searching for each of the received data objects in the dictionary contained in the first means;

for each data object present in the dictionary, obtaining a representative index code cross-referenced to the data object in the dictionary; and composing a message to the receiving device, the message including multiple subparts each subpart corresponding to a different one of the received data objects, each subpart comprising:

if the corresponding data object is not present in the dictionary, the content of the data object; and if the corresponding data object is present in the dictionary, the index code cross-referenced to the data object;

where the composed message further includes one or more flags distinguishing between index codes and non-dictionary data objects in the message.

32. A data receiving device, comprising:

first means for storing digital data, the first means containing a dictionary containing multiple data objects and cross-referencing each of the data objects with a different dictionary index code, where the data objects include data objects with one of the following types: a binary graphics file, or a binary executable program; and second means, coupled to the store, for receiving data from a sending device by:

receiving a message including multiple subparts each subpart corresponding to a different data object and comprising:

if the corresponding data object is not present in the dictionary, the content of the data object; and if the corresponding data object is present in the dictionary, the index code cross-referenced to the data object;

the message further including one or more flags distinguishing between dictionary index codes and non-dictionary data objects; and in response to receiving the message, the second means performing operations to process the message comprising:

reviewing the flags in the received message to distinguish between dictionary index codes and non-dictionary data objects;

for each subpart comprising an index code, cross-referencing the index code in the dictionary contained in the receiving device's store to obtain the cross-referenced data object, and for each obtained data object that is a binary graphics file, operating the receiving device's processor to display an image represented by said binary graphics file;

for each obtained data object that is a binary executable program, operating the receiving device's processor to execute said program; and for each subpart comprising a non-dictionary data object, providing an output of the non-dictionary data object.

33. A method for conducting communications between first and second computing machines, the computing machines including respective copies of a common dictionary, the method comprising operations of:

at the first computing machine, designating multiple data objects for transmission to the second computing machine, where the data objects include some data objects with one of the following types: a binary graphics file readable by a processor to display a represented data object, or a binary instruction sequence executable by a processor to run a program;

determining whether each designated data object is present in the first computing machine's dictionary, and if the data object is present in the dictionary, obtaining a representative index code cross-referenced to the data object in the dictionary, and preparing a transmission that substitutes the index code for the data object;

otherwise, if the data object is not present in the dictionary, preparing a transmission that includes a non-dictionary representation of the data object;

sending the transmission to the second computing machine;

at the second computing machine, receiving transmissions from the first computing machine;

for each transmission, analyzing contents of the transmission to determine whether the transmission includes an index code;

if the transmission includes an index code, cross-referencing the index code in the second computing machine's dictionary to obtain the data object;

determining the data object's type, and if the data object is a graphics file, operating the second computing machine to read the graphics file and display the image represented thereby;

if the data object is an instruction sequence, operating the second computing machine to execute the program.

34. The method of claim 33, where the data object types further include text.

* * * * *

UNITED STATES PATENT AND TRADEMARK OFFICE
CERTIFICATE OF CORRECTION

PATENT NO.     : 6,088,699
DATED          : July 11, 2000
INVENTOR(S)    : James Michael Gampper et al.

It is certified that error appears in the above-identified patent and that said Letters Patent is hereby corrected as shown below:

Column 12,
Line 17, delete the word "the" between "process the" and "message comprising".

Column 14,
Line 23, delete the word "the" between "programmed to perform" and "a method for exchanging data."

Signed and Sealed this

Fifteenth Day of October, 2002

*Attest:*

*Attesting Officer*

JAMES E. ROGAN
*Director of the United States Patent and Trademark Office*